United States Patent

Saishouji et al.

[11] Patent Number: 6,030,450
[45] Date of Patent: Feb. 29, 2000

[54] METHOD OF FABRICATING A SILICON SINGLE CRYSTAL

[75] Inventors: Toshiaki Saishouji; Takashi Yokoyama; Hirotaka Nakajima; Toshimichi Kubota; Kouzou Nakamura, all of Kanagawa, Japan

[73] Assignee: Komatsu Electronic Metals Co., Ltd., Kanagawa, Japan

[21] Appl. No.: 08/998,609

[22] Filed: Dec. 29, 1997

[30] Foreign Application Priority Data

Dec. 27, 1996 [JP] Japan ................................. 8-357513

[51] Int. Cl.[7] .................................................. C30B 15/00
[52] U.S. Cl. ............................... 117/13; 117/14; 117/15; 117/20
[58] Field of Search .................. 117/13, 14, 15, 117/20, 201, 202

[56] References Cited

U.S. PATENT DOCUMENTS

| | | | |
|---|---|---|---|
| 5,474,020 | 12/1995 | Bell et al. | 117/20 |
| 5,487,355 | 1/1996 | Chiou et al. | 117/15 |
| 5,779,791 | 7/1998 | Korb et al. | 117/15 |

*Primary Examiner*—Felisa Hiteshew
*Attorney, Agent, or Firm*—Sughrue, Mion, Zinn, Macpeak & Seas, PLLC

[57] ABSTRACT

The cooling speed of the portion near the rear part of a single-crystal body and passing through the defect-forming temperature zone is kept the same as that of the front portion of the single-crystal body. Namely, the heater is kept in operation while pulling the single crystal silicon subsequent to forming the tail of the single crystal silicon and the cooling speed throughout the whole single-crystal body in the defect-forming temperature zone is kept below 15° C./min (levels A and B). Furthermore, the length of the tail is preset in the process of pulling the single crystal silicon so that the single-crystal body cools down slowly while passing through the defect-forming temperature zone (level C). In addition, the temperature of the portion near the rear part of the single-crystal body under pulling is below the minimum temperature of the defect-forming temperature zone by shortening the distance between melted liquid surface and the portion passing through the defect-forming temperature zone of the single-crystal, and by increasing the temperature gradient along the single-crystal axis (level D).

12 Claims, 5 Drawing Sheets

METHOD OF FABRICATING A SILICON SINGLE CRYSTAL

BACKGROUND OF THE INVENTION

1. Field of the Invention

This invention relates to a method of fabricating a single crystal silicon by the Czochralski method (hereinafter referred as the CZ method), particularly to a method for manufacturing single crystal silicons, which is capable of preventing the occurrence of defects within the portion near the rear part of a single-crystal body.

2. Description of the Related Art

The substrates of semiconductor components are mainly made of high-purity single crystal silicon that is conventionally produced by the CZ method. In the CZ method, polycrystalline silicon lumps are fed into a quartz crucible of a single crystal silicon pulling device. Then the quartz crucible is heated by cylindrical heaters disposed therearound to melt the polycrystalline silicon lumps, thereafter a seed crystal installed on a seed chuck is dipped into the melt of raw material. After that, the seed chuck and the quartz crucible are respectively driven to rotate in opposite or identical directions, and at the same time the seed chuck is pulled to grow a single-crystal silicon ingot of predetermined diameter and length.

In device processes, various heat treatments are applied on single crystal silicons produced by the CZ method. However, as shown by the dotted graph in FIG. 6, there exists a portion near the rear part of a single-crystal body 2 whose diameter is constant, which has markedly greater oxygen precipitation than other portions. In addition, as shown by the solid graph in FIG. 6, there is a shadowed section located near the rear part of the single-crystal body 2 that has the fragment containing anomalous oxygen precipitation (hereinafter referred as AOP) as its boundary. In the above section, there is a high density of grown-in defects such as Lazer Scattering Tomography Defect (hereinafter referred as LSTD), Flow Pattern Defect (hereinafter referred as FPD), and Crystal Originated Particle (hereinafter referred as COP), which greatly affect the breakdown voltage of the oxidation film of the devices, and the distribution of the defects is uneven. The above phenomenon is caused during the cooling process subsequent to the pulling of single crystals. Semiconductor devices made of wafers sliced from a zone closer to the tail portion than the AOP fragment will display greater current leakage and inferior oxidation film voltage-endurance strength, thus severely decreasing the yield. The greater current leakage is induced by excessive oxygen precipitation in the device processes. In other words, the zone closer to the tail than the AOP fragment can not be made into high-quality silicon wafers via the CZ method, and this is one of major causes of the low yield for single crystal silicons.

SUMMARY OF THE INVENTION

In view of the above drawbacks, the object of the present invention is to provide a method for manufacturing silicon wafers, which can prevent the occurrence of AOP in the portion near the rear part of a single-crystal body and equalize the distribution of grown-in defects.

To achieve the above object, the method for manufacturing single crystal silicons according to this invention is characterized in that in the process of manufacturing single crystal silicons by the CZ method, the cooling speed of the portion near the rear part of a single-crystal body, passing through the defect-forming temperature zone is controlled to be the same as that of the front portion of the single-crystal body.

A first aspect of the method of fabricating a single crystal silicon by the CZ method, is a method of the present invention, which comprises the steps of:

forming a neck portion;

forming a shoulder portion; and forming a body portion by pulling from a melt of raw material in a crucible while heating the crucible by a main heater, successively while cooling the pulled single crystal, wherein the cooling speed of the portion near the rear part of a single-crystal body is controlled so that the portion near the rear part of a single-crystal body passes through the defect-forming temperature zone at the cooling speed same as that of the front portion of the single-crystal body.

A second aspect of the method of fabricating a single crystal silicon is a method according to the first aspect, which comprises the steps of:

a step of pulling the single crystal silicon while the heater is kept in operation after cutting the rear end of the single crystal silicon off from the melt so as to terminate forming of the single crystal silicon.

A third aspect of the method of fabricating a single crystal silicon is a method according to the second aspect, which further comprises a step of forming a tail portion after the step of forming a body portion.

A fourth aspect of the method of fabricating a single crystal silicon is a method according to the second aspect, wherein the step of forming the body portion comprises the step of cutting the rear end of the body portion off from the melt so as to terminate forming of the single crystal silicon without forming a tail portion.

A fifth aspect of the method of fabricating a single crystal silicon is a method according to the third aspect, wherein the cooling speed throughout the whole body portion in the defect-forming temperature zone is maintained at less than 15° C./min.

A sixth aspect of the method of fabricating a single crystal silicon is a method according to the fifth aspect, wherein the speed of pulling the single crystal silicon is maintained at less than 8 mm/min.

A seventh aspect of the method of fabricating a single crystal silicon is a method according to the fourth aspect, wherein the cooling speed throughout the whole body portion in the defect-forming temperature zone is maintained at less than 15° C./min.

A eighth aspect of the method of fabricating a single crystal silicon is a method according to the seventh aspect, wherein the speed of pulling the single crystal silicon is maintained at less than 8 mm/min.

A ninth aspect of the method of fabricating a single crystal silicon is a method according to the first aspect, wherein the step of forming a single crystal silicon comprise:

a step of pulling the single crystal silicon after cutting the rear end of the single crystal silicon off from the melt so as to terminate forming of the single crystal silicon and stopping the heater operating, while controlling so that the cooling speed throughout the whole body portion in the defect-forming temperature zone is maintained at less than 15° C./min.

A tenth aspect of the method of fabricating a single crystal silicon is a method according to the ninth aspect, wherein in the step of pulling the single crystal silicon the cooling rate of the body portion is controlled by disposing at least one of an adiabatic cylinder and a sub heater near the melt.

An eleventh aspect of the method of fabricating a single crystal silicon is a method according to the first aspect, which further comprises steps of:

forming a tail portion having a predetermined length;

cutting the rear end of the tail portion off from the melt after the step of forming a tail portion so as to terminate forming of the single crystal silicon; and stopping the main heater operating, wherein the tail length is controlled so that: the point of cutting the rear end of the body portion is passed though the undermost defect-forming temperature zone; and that the cooling speed throughout the whole body portion in the defect-forming temperature zone is maintained at less than the predetermined speed.

A twelfth aspect of the method of fabricating a single crystal silicon is a method according to the first aspect, which further comprises the steps of:

forming a tail portion;

cutting the rear end of the tail portion off from the melt after the step of forming a tail portion so as to terminate forming of the single crystal silicon;

and stopping the main heater operating, wherein the temperature distribution in a pulling apparatus is controlled: by shortening the distance between melt surface and the portion passing through the defect-forming temperature zone of the single-crystal; and by increasing the temperature gradient along the single-crystal axis, so that the portion near the rear part of the body portion on pulling is become lower than the minimum temperature of the defect-forming temperature zone before terminating of forming the single crystal silicon.

A thirteenth aspect of the method of fabricating a single crystal silicon is a method according to the first aspect, wherein the defect-forming temperature zone is within a range between 1150–1080° C.

AOP is formed from oxygen precipitation with the aid of vacancies retained in the single crystals during pulling. The above oxygen precipitation is commonly precipitated in a form of a nucleus at temperatures ranging from 800° C. to 600° C. A grown-in defect is formed by aggregated vacancies that become over-saturated when a single crystal silicon is being pulled within a temperature zone substantially ranging from 1150° C. to 1080° C. As it passes through the above temperature zone, the higher the cooling speed, the higher the defect density becomes. FIG. 1 is a schematic diagram showing the distributions of vacancy concentration and grown-in defect density prior to a cooling process, which is subsequent to the formation of the tail portion of a single-crystal body. The tail $2b$ of the single crystal silicon 2 has just left the melted liquid, and the boundary between the A-region and the B-region is the temperature zone ranging from 1150° C. to 1080° C. Prior to the cooling process, the grown-in defects in the B-region are developing and are not yet created, therefore the grown-in defect density is quite low. However, once the cooling process begins (the power of the heater is cut off and the single-crystal ingot is pulled), the cooling speed of the B-region in the temperature zone ranging from 1150° C. to 1080° C. becomes higher than that of the A-region. Therefore, the grown-in defect density in the B-region is higher than that in the A-region. Furthermore, during the formation of the grown-in defects (the concentration of vacancies is decreasing), the concentration of vacancies in the portion near the boundary between the A-region and the B-region is inadequate, and the state is kept unchanged. As a result, the defect distribution becomes that shown in FIG. 2, and AOP appears at sites of retained vacancies during the subsequent precipitation heat treatment. Accordingly, if it is possible to avoid rapid variations to cooling speed of the body in the temperature zone ranging from 1150° C. to 1080° C. when shifting from the tail process to cooling process, then the occurrence of AOP and the uneven distribution of grown-in defects can be prevented.

According to this invention, one concrete means for controlling the cooling speed of the portion near the rear part of a single-crystal body is to terminate pulling of the single crystal silicon after forming the tail of the single crystal silicon or after cutting the rear portion of the single crystal silicon off from the melted liquid without forming the tail, and to keep the heater operating during raising of the single crystal silicon.

After the single crystal silicon has left the melted liquid, heat can not be transferred from the melted liquid. Therefore, the cooling speed of the single crystal silicon is increased. However, if the heater is kept operating then the portion near the rear part of the single-crystal body will be cooled down slowly, and the cooling speed of the portion near the rear part, passing through the defect-forming temperature zone, becomes to be the same as that of the front part of the single-crystal body. Therefore, the occurrence of AOP can be prevented.

Furthermore, another concrete means for controlling the cooling speed of the portion near the rear part of the single-crystal body is to keep the above heater operating and to maintain the speed at which the single crystal silicon is pulled to less than 8 mm/min, and to control the cooling speed throughout the whole single-crystal body in the defect-forming temperature zone less than 15° C./min.

In accordance with experiments, the critic cooling speed for the occurrence of AOP is 15° C./min. Therefore, if the single-crystal body is cooled down slowly while passing through the defect-forming temperature zone as above-described, then the occurrence of AOP can be prevented.

Furthermore, another concrete means for controlling the cooling speed of the portion near the rear part of the single-crystal body is to preset the length of the tail so as to have the single-crystal body cool down slowly while passing through the defect-forming temperature zone in the process of pulling the single crystal silicon.

If the portion near the rear part of the single-crystal body has passed the defect-forming temperature zone in the process of pulling the single crystal silicon, in other words, before the tail leaves the melted liquid, the portion near the rear part of the single-crystal body has passed the defect-forming temperature zone, then the single-crystal body will not be cooled down rapidly. Therefore, by setting the tail length to a necessary value, it is possible to have the single-crystal body pass through the defect-forming temperature zone during the formation of the tail.

Furthermore, another concrete means for controlling the cooling speed of the portion near the rear part of the single-crystal body is to shorten the distance between melted liquid surface and the portion passing through the defect-forming temperature zone of the single-crystal, and to control the temperature of the portion near the rear part of the single-crystal body to become lower than the undermost temperature of the defect-forming temperature zone before terminating of forming the single crystal silicon by increasing the temperature gradient along the single-crystal axis.

When the temperature gradient along the single crystal silicon axis is increased, the distance between melted liquid surface and the portion passing through the defect-forming temperature zone of the single-crystal can be shortened. Therefore, it is possible to have the rear part of the single-crystal body pass through the defect-forming temperature zone before the tail leaves the melted liquid.

By utilizing the above various means, the occurrence of AOP in the portion near the rear part of the single-crystal body can be prevented, and the defect density in the rear part of the single-crystal body can thus be kept as low as that in the front portion of the single-crystal body.

BRIEF DESCRIPTION OF THE DRAWINGS

The present invention can be more fully understood by reading the subsequent detailed description and examples with reference made to the accompanying drawings, wherein.

DETAILED DESCRIPTION OF THE PREFERRED EMBODIMENTS

Figure 1:
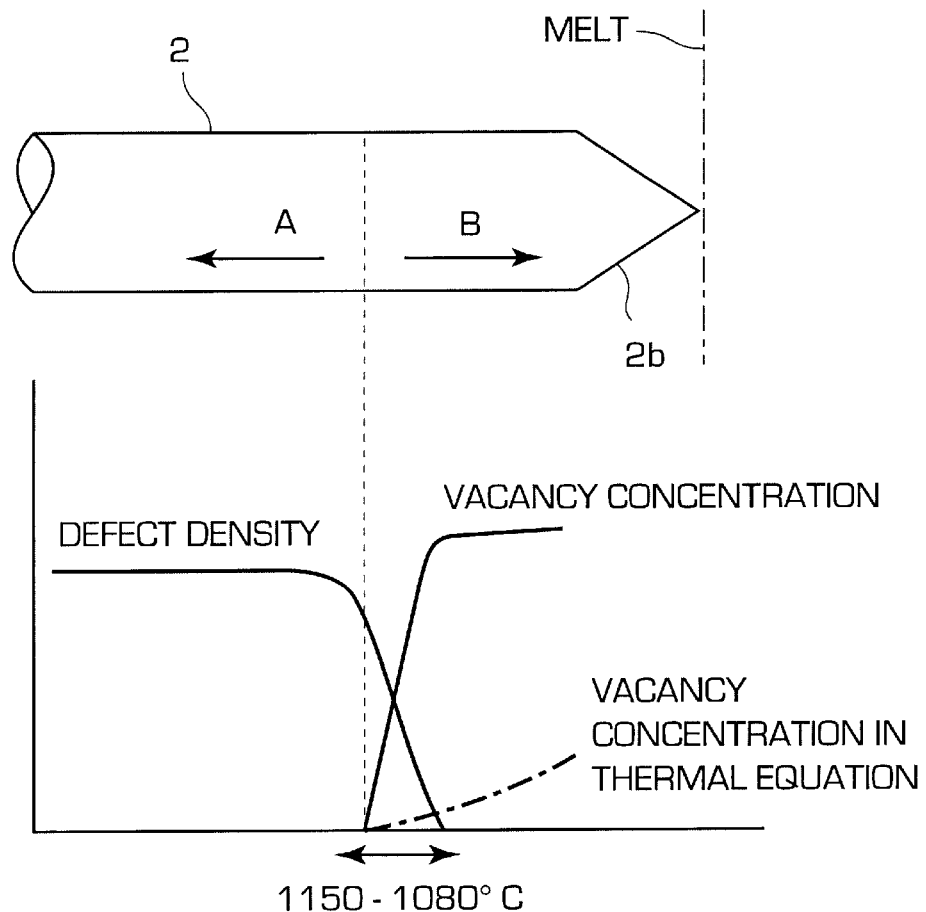
FIG. 1 is a schematic diagram showing the distributions of vacancy concentration and grown-in defect density after the formation of the tail portion of a single-crystal body.
Figure 2:
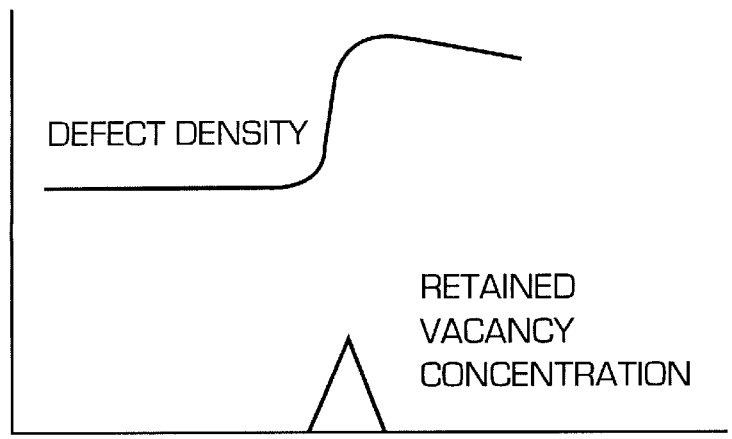
FIG. 2 is a diagram showing the defect density and retained vacancy concentration detected within the rear portion of a single-crystal body at last.
Figures 3A, 3B, 3C:
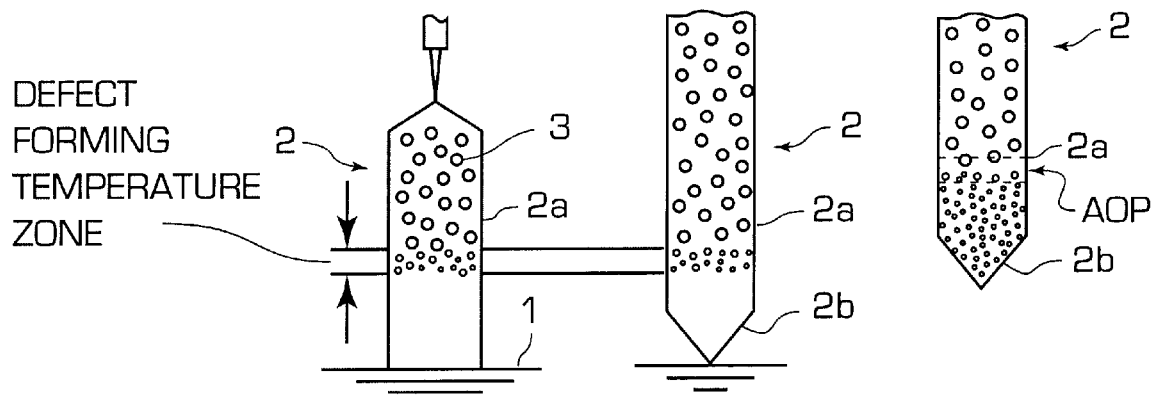
FIG. 3(a) is an illustration showing the state of defects formed at the stage of pulling a single crystal.
FIG. 3(b) is an illustration showing the state of defects formed prior to the cooling process.
FIG. 3(c) is an illustration showing the state of defects after the cooling process.
Figure 4:
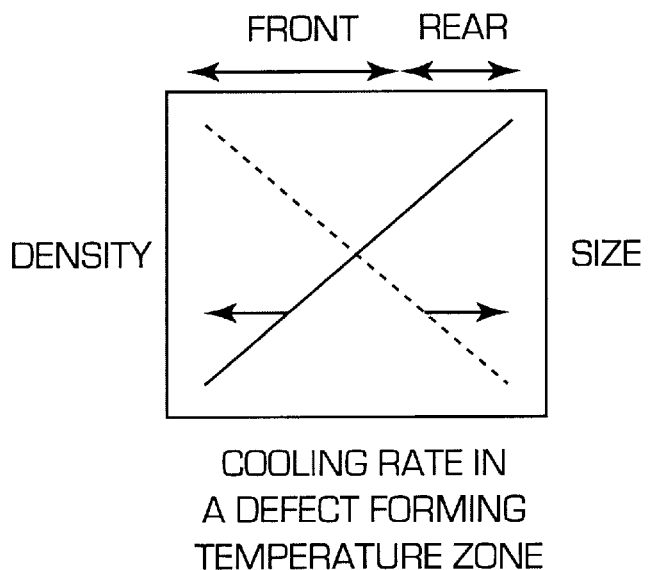
FIG. 4 is a diagram showing the relationship between cooling speed in the defect-forming temperature zone and defect density as well as defect size.

The following is a description of an embodiment of the method for manufacturing single crystal silicons, according to this invention, with reference made to the drawings. FIG. 3(a) is an illustration showing the state of defects formed at the stage of pulling a single crystal. FIG. 3(b) is an illustration showing the state of defects formed prior to the cooling process. FIG. 3(c) is an illustration showing the state of defects after the cooling process. FIG. 4 is a diagram showing the relationship between cooling speed in the defect-forming temperature zone and defect density as well as defect size. FIG. 3(a) shows the state of pulling the front body 2a of a single crystal silicon 2 from the melted liquid 1. When the body 2a passes through the defect-forming temperature zone ranging from 1150° C. to 1080° C., grown-in defects occur. Then, the size of the grown-in defects gradually grows bigger until they finally become the defects 3 of uniform defect density.

FIG. 3(b) shows the state prior to the cooling process following the formation of the body 2a and the tail 2b. Just like that shown in FIG. 3(a), grown-in defects occur in the portion near the rear part of the body 2a, while it passes through the defect-forming temperature zone. FIG. 3(c) shows the state after the cooling process. In the cooling process, due to the fact that the power of the heater for heating an crucible filled with raw material, has been cut off and the single crystal 2 has been pulled, the cooling speed of the portion formed subsequent to the rear part of the body 2a becomes higher than that of the rear part. Therefore, AOP as well as high-density grown-in defects will be detected from the portion below the defect-forming temperature zone.

As shown in FIGS. 3(a), 3(b), and 3(c), the location of AOP occurrence depends on the forming temperature of grown-in defects. At the time the pulling of the single crystal has finished and the cooling process has just begun, uneven distribution of grown-in defects occurs within the portion commencing from the location of AOP occurrence to the crystal-seed side as well as the tail side. In other words, the portion just passes through the defect-forming temperature zone. Furthermore, it is known from FIG. 4 that the above uneven distribution of grown-in defects is affected by the cooling speed in the defect-forming temperature zone.

Furthermore, it is deemed that AOP is incurred by oxygen precipitation, which is brought about by vacancies retained during the reaction between defects and vacancies at the boundary of the defect-distributed zone. Therefore, to eliminate the uneven distribution of the defects unquestionably implies a restraint of the occurrence of AOP.

Based on the above description, it is possible to control AOP and the uneven distribution of the defects by keeping the cooling speed of the portion near the rear part of the single-crystal body, passing through the defect-forming temperature zone, the same as that of the front part of the single-crystal body.

Figure 7:
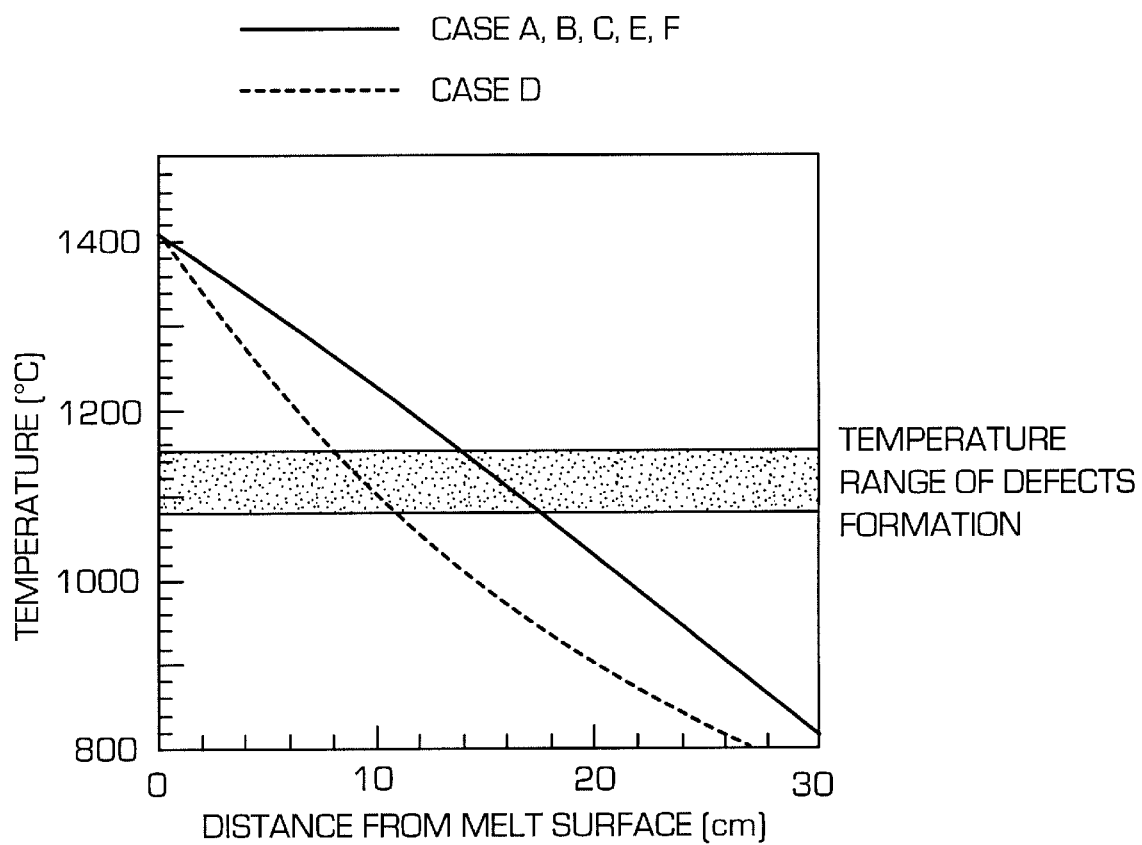
FIG. 7 is an explanatory diagram for showing a relationship between temperature and distance from melt surface in the embodiments of the present invention.

Six single crystal silicons of 150 mm diameter were produced respectively according to the method of this invention and a conventional method. The crystal-pulling conditions and the crystal cooling conditions with respect to four levels A–D (this invention) and two levels E, F (conventional method) are respectively listed in Table 1 and Table 2. FIG. 7 is an explanatory diagram for showing a relationship between temperature and distance from melt surface in the embodiments of the this invention and conventional method.

TABLE 1

Wherein *1 and *2 respectively denote the
Temperature zone of 1150° C.~1080° C. and the location of 1100° C.

| | | | Crystal-pulling Conditions | | | | |
| --- | --- | --- | --- | --- | --- | --- | --- |
| Grouping | Level | Crystal diameter (mm) | Average pulling speed (mm/min) | Temperature gradient in the defect-forming temperature zone *1 (° C./mm) | Cooling speed in the defect-forming temperature zone *1 (° C./min) | Distance between defect-forming temperature Zone *2 and the melted liquid surface (cm) | Tail length (cm) |
| Embodiment | A | 150 | 0.7 | 2.0 | 1.4 | 16.0 | 12 |
| | B | 150 | 0.7 | 2.0 | 1.4 | 16.0 | 12 |
| | C | 150 | 0.7 | 2.0 | 1.4 | 16.0 | 18 |

TABLE 1-continued

Wherein *1 and *2 respectively denote the
Temperature zone of 1150° C.~1080° C. and the location of 1100° C.

Crystal-pulling Conditions

| Grouping | Level | Crystal diameter (mm) | Average pulling speed (mm/min) | Temperature gradient in the defect-forming temperature zone *1 (° C./mm) | Cooling speed in the defect-forming temperature zone *1 (° C./min) | Distance between defect-forming temperature Zone *2 and the melted liquid surface (cm) | Tail length (cm) |
|---|---|---|---|---|---|---|---|
|  | D | 150 | 0.7 | 2.5 | 1.75 | 10.0 | 12 |
| Prior Art | E | 150 | 0.7 | 2.0 | 1.4 | 16.0 | 12 |
|  | F | 150 | 0.7 | 2.0 | 1.4 | 16.0 | 12 |

TABLE 2

Wherein *1 denotes the temperature zone of 1150° C.~1080° C.

Crystal Cooling Conditions

| Grouping | Level | Crystal diameter (mm) | Heater power on/off after pulling the crystal | Crystal-pulling speed after pulling the crystal (mm/min) | Temperature gradient in the defect-forming temperature zone *1 (° C./mm) | Cooling speed in the defect-forming temperature zone *1 (° C./min) |
|---|---|---|---|---|---|---|
| Embodiment | A | 150 | ON | 7.5 | 2.0 | 15.0 |
|  | B | 150 | ON | 0.7 | 2.0 | 1.4 |
|  | C | 150 | OFF | — | — | 20.0 |
|  | D | 150 | OFF | — | — | 20.0 |
| Prior Art | E | 150 | OFF | — | — | 20.0 |
|  | F | 150 | ON | 8.0 | 2.0 | 16.0 |

The crystal-pulling conditions of levels A and B are set to be the same, and the length of tail is set to be 12 cm. At level A, in the process of cooling crystal, the power of the heater was kept and the single crystal was pulled at a speed of 7.5 mm/min, while the cooling speed in the defect-forming temperature zone was 15.0° C./min. At level B, the power of the heater was kept and the single crystal was pulled at a speed of 0.7 mm/min, and the cooling speed in the defect-forming temperature zone was 1.4° C./min.

The crystal-pulling conditions of level C were the same as those of levels A and B except for the tail length. The tail length of level C was 18 cm, which is 6 cm longer than those of the other levels. Among the crystal-pulling conditions of level D, the temperature gradient in the defect-forming temperature zone was changed to 2.5° C./mm and the cooling speed in the defect-forming temperature zone was changed to 1.75° C./min due to the change of adiabatic structure of the heat-shield cylinder. Also, the distance between defect-forming temperature zone and the melted liquid surface was shortened to 10.0 cm. The crystal cooling conditions of levels C and D were the same, and the heater power was cut out after pulling the crystal.

The crystal-pulling conditions of levels E and F were the same as those of levels A and B. However, with respect to the crystal-pulling conditions, the heater power of level E was cut out and the heater power of level F was kept. In level F, the crystal raising speed was 8.0 mm/min, while the cooling speed in the defect-forming temperature zone was 16.0° C./min.

Figure 5:
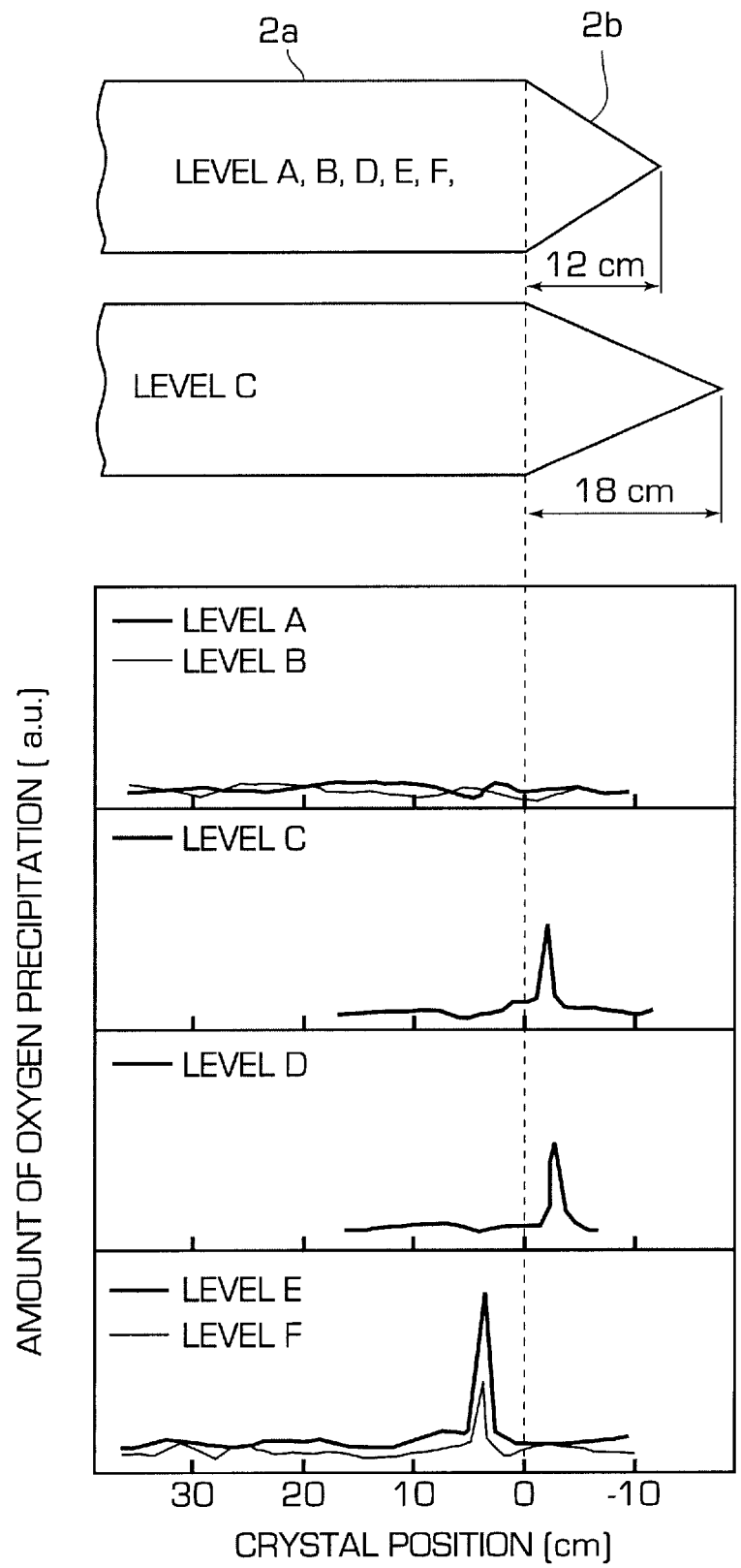
FIG. 5 is an illustration showing quantities of oxygen precipitated at different locations in various single crystals.
Figure 6:
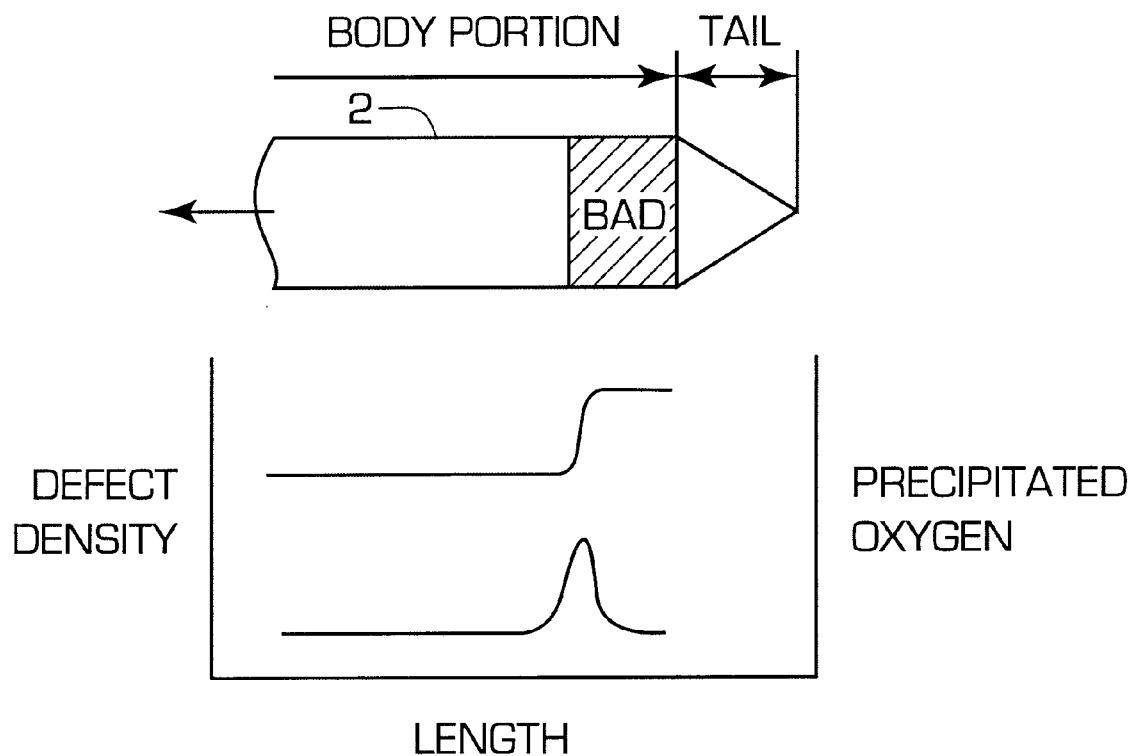
FIG. 6 is an illustration showing defect density and abnormal oxygen precipitation in the portion near the rear part of a single crystal.

The silicon crystals produced under the above different conditions were sliced into mirror wafers of thickness 625 µm, whose oxygen density in crystal lattices were measured by the Fulier Transition Infrared (hereinafter referred as FTIR) method. Furthermore, the above wafers were subjected to an oxygen precipitation heat-treatment, namely, heated to 780° C. for 3 hours plus 1000° C. for 16 hours, then the oxygen densities in crystal lattices were measured by the FTIR method. The differences between oxygen densities in crystal lattices measured before heat-treatment and after heat-treatment were taken as quantities of oxygen precipitated. Quantities of oxygen precipitated at different locations along the crystal axial direction are shown in FIG. 5.

The quantities of oxygen precipitated in levels A and B were substantially the same from the crystal bodies to the tails, and no AOP was found therein. In contrast, AOP was found in the tails of levels C and D, yet no AOP was found in the bodies of levels C and D. Level C This is owing that the tail portion is so long that the body portion has already passed through the defect-forming temperature zone at the point that the heater is swiched off. The above result is due to the low cooling speed of the portion near the rear part of a single-crystal body passing through the defect-forming temperature zone. Compared with the above, in levels E and F of the prior art, AOP occurred in the portion near the rear parts of the single-crystal bodies. In level F, the heater power was kept ON even after the commencement of cooling process, however AOP was still found since the cooling speed in the defect-forming temperature zone was too high.

As described above, according to this invention, the cooling speed of the portion, near the rear part of a single-crystal body, passing through the defect-forming temperature zone ranging from 1150° c to 1080° c, was controlled to be the same as that of the front portion of the single-crystal body. Therefore, it is possible to eliminate the problem that was difficult to resolve by conventional methods, such as the occurrence of AOP in the portion near the rear part of a single-crystal body and the uneven distribution of grown-in defects such as LSTD in accordance with AOP, in LSTD. Accordingly, it is possible to obtain a single crystal silicon with high gate oxide integrity and high yield throughout its entire length.

What is claimed is:

1. A method of fabricating a single crystal silicon by a Czochralski (CZ) technique, comprising the steps of:

forming a neck portion;

forming a shoulder portion;

forming a body portion by pulling from a melt of raw material in a crucible while heating the crucible by a main heater, successively while cooling the pulled single crystal; and pulling the single crystal silicon while the heater is kept in operation after cutting the rear end of the single crystal silicon off from the melt so as to terminate forming of the single crystal silicon wherein a portion near the rear part of a single-crystal body passes through a defect-forming temperature zone at a rear cooling speed and a front portion passing through the defect forming temperature zone at a front cooling speed and the front cooling speed and the rear cooling speed are same.

2. The method of fabricating a single crystal silicon as claimed in claim 1, further comprising a step of forming a tail portion after the step of forming a body portion.

3. The method of fabricating a single crystal silicon as claimed in claim 2, wherein the cooling speed throughout the whole body portion in the defect-forming temperature zone is maintained at less than 15° C./min.

4. The method of fabricating a single crystal silicon as claimed in claim 3, wherein the speed of pulling the single crystal silicon is maintained at less than 8 mm/min.

5. The method of fabricating a single crystal silicon as claimed in claim 1, wherein the step of forming the body portion comprises the step of cutting the rear end of the body portion off from the melt so as to terminate forming of the single crystal silicon without forming a tail portion.

6. The method of fabricating a single crystal silicon as claimed in claim 5, wherein the cooling speed throughout the whole body portion in the defect-forming temperature zone is maintained at less than 15° C./min.

7. The method of fabricating a single crystal silicon as claimed in claim 6, wherein the speed of pulling the single crystal silicon is maintained at less than 8 mm/min.

8. A method of fabricating a single crystal silicon by a Czochralski (CZ) technique, comprising the steps of:

forming a neck portion;

forming a shoulder portion;

forming a body portion by pulling from a melt of raw material in a crucible while heating the crucible by a main heater, successively while cooling the pulled single crystal; and pulling the single crystal silicon after cutting the rear end of the single crystal silicon off from the melt so as to terminate forming of the single crystal silicon and stopping the heater operating, while controlling so that the cooling speed throughout the whole body portion in the defect-forming temperature zone is maintained at less than 15° C./min wherein a portion near the rear part of a single-crystal body passes through a defect-forming temperature zone at a rear cooling speed and a front portion passing through the defect forming temperature zone at a front cooling speed and the front cooling speed and the rear cooling speed are same.

9. The method of fabricating a single crystal silicon as claimed in claim 8, wherein in the step of pulling the single crystal silicon the cooling rate of the body portion is controlled by disposing at least one of an adiabatic cylinder and a sub heater near the melt.

10. A method of fabricating a single crystal silicon by a Czochralski (CZ) technique, comprising the steps of:

forming a neck portion;

forming a shoulder portion;

forming a body portion by pulling from a melt of raw material in a crucible while heating the crucible by a main heater, successively while cooling the pulled single crystal;

forming a tail portion;

cutting the rear end of the tail portion off from the melt after the step of forming a tail portion so as to terminate forming of the single crystal silicon; and stopping the main heater operating, wherein a portion near the rear part of a single-crystal body passes through a defect-forming temperature zone at a rear cooling speed and a front portion passing through the defect forming temperature zone at a front cooling speed and the front cooling speed and the rear cooling speed are the same, and wherein the tail length is controlled so that: the point of cutting the rear end of the body portion is passed through the undermost defect-forming temperature zone; and that a cooling speed throughout the whole body portion in the defect-forming temperature zone is maintained at less than 1.5° C./min.

11. A method of fabricating a single crystal silicon by the CZ method, comprising the steps of:

forming a neck portion;

forming a shoulder portion; and forming a body portion by pulling from a melt of raw material in a crucible while heating the crucible by a main heater, successively while cooling the pulled single crystal, forming a tail portion;

cutting the rear end of the tail portion off from the melt after the step of forming the tail portion so as to terminate forming of the single crystal silicon;

and stopping the main heater operating, wherein the cooling speed of the portion near the rear part of a single-crystal body is controlled so that the portion near the rear part of a single-crystal body passes through the defect-forming temperature zone at the cooling speed same as that of the front portion of the single-crystal body, wherein the temperature distribution in a pulling apparatus is controlled by shortening the distance between melt surface and the portion passing through the defect-forming temperature zone of the single-crystal and by increasing the temperature gradient along the single-crystal axis, so that the portion near the rear part of the body portion on pulling becomes lower than the minimum temperature of the defect-forming temperature zone, before terminating formation of the silicon single crystal.

12. A method of fabricating a single crystal silicon by the CZ method, comprising the steps of:

forming a neck portion;

forming a shoulder portion; and forming a body portion by pulling from a melt of raw material in a crucible while heating the crucible by a main heater, successively while cooling the pulled single crystal, wherein the cooling speed of the portion near the rear part of a single-crystal body is controlled so that the portion near the rear part of a single-crystal body passes through the defect-forming temperature zone at the cooling speed same as that of the front portion of the single-crystal body, and wherein the defect-forming temperature zone is within a range between 1150–1080° C.

* * * * *